(12) United States Patent
Suzuki et al.

(10) Patent No.: US 8,525,175 B2
(45) Date of Patent: Sep. 3, 2013

(54) ELECTRONIC DEVICE HAVING AN ISOLATING ELEMENT AND DISPLAY APPARATUS INCLUDING THE ELECTRONIC DEVICE

(75) Inventors: Sho Suzuki, Yamato (JP); Katsumi Abe, Kawasaki (JP); Ryo Hayashi, Yokohama (JP); Hideya Kumomi, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 134 days.

(21) Appl. No.: 13/161,328

(22) Filed: Jun. 15, 2011

(65) Prior Publication Data

US 2012/0007085 A1 Jan. 12, 2012

(30) Foreign Application Priority Data

Jul. 8, 2010 (JP) ................................. 2010-155920

(51) Int. Cl.
*H01L 29/04* (2006.01)
(52) U.S. Cl.
USPC ..................................... 257/59; 257/E29.117
(58) Field of Classification Search
USPC .................. 257/59, 72, 291, 292, 83, 84, 88, 257/89, 184, 187, 257, 258, 43, E27.1, E29.117, 257/E29.273
See application file for complete search history.

(56) References Cited

U.S. PATENT DOCUMENTS

| | | | |
|---|---|---|---|
| 4,942,600 A | 7/1990 | Suzuki | |
| 4,962,412 A | 10/1990 | Shinohara et al. | |
| 5,060,042 A * | 10/1991 | Shinohara et al. | 257/290 |
| 5,138,655 A | 8/1992 | Takashima et al. | |
| 5,535,418 A | 7/1996 | Suzuki | |
| 5,586,172 A | 12/1996 | Sakurai et al. | |
| 5,594,944 A | 1/1997 | Ogata et al. | |
| 5,602,910 A | 2/1997 | Tsutsui et al. | |
| 5,884,077 A | 3/1999 | Suzuki | |
| 8,009,157 B2 | 8/2011 | Shimizu et al. | |
| 8,030,663 B2 * | 10/2011 | Yamazaki et al. | 257/78 |
| 2008/0291350 A1* | 11/2008 | Hayashi et al. | 349/47 |
| 2011/0062992 A1* | 3/2011 | Okazaki et al. | 326/102 |
| 2011/0187888 A1 | 8/2011 | Shimizu et al. | |
| 2011/0188878 A1 | 8/2011 | Watanabe et al. | |
| 2012/0146147 A1* | 6/2012 | Hook | 257/351 |

FOREIGN PATENT DOCUMENTS

| | | |
|---|---|---|
| JP | 8-4131 | 8/1988 |
| JP | 6-275833 A | 9/1994 |
| JP | 9-213895 A | 8/1997 |
| JP | 2007-103815 A | 4/2007 |
| JP | 2007-220713 A | 8/2007 |

\* cited by examiner

*Primary Examiner* — Bilkis Jahan
(74) *Attorney, Agent, or Firm* — Fitzpatrick, Cella, Harper & Scinto

(57) ABSTRACT

An electronic device includes: multiple electronic elements each including a semiconductor film; and an element isolation region provided between adjacent ones of the multiple electronic elements, the element isolation region including a semiconductor film having a bandgap of 1.95 eV or more, an insulating film, and an element isolation electrode, the element isolation electrode being an electrode which is separated from the semiconductor film of the element isolation region by the insulating film and is applied with a voltage so as to increase a resistance of the semiconductor film of the element isolation region, to thereby electrically isolate the multiple electronic elements from one another.

7 Claims, 5 Drawing Sheets

ELECTRONIC DEVICE HAVING AN ISOLATING ELEMENT AND DISPLAY APPARATUS INCLUDING THE ELECTRONIC DEVICE

BACKGROUND OF THE INVENTION

1. Field of the Invention

The present invention relates to an electronic device including semiconductor electronic elements, and more particularly, to an electronic device having an improved structure for element isolation of electronic elements, a method of isolating elements of the electronic device, a method of producing the electronic device, and a display apparatus including the electronic device.

2. Description of the Related Art

In recent years, in a display apparatus including a display element such as a liquid crystal cell or an electroluminescent element (EL element), there have been used, as electronic elements for driving the display element, multiple thin film transistors (TFTs) which use amorphous silicon, polysilicon, and the like for respective channel regions.

Currently, there is a growing demand for high resolution display apparatuses, for example, a high resolution liquid crystal display device. One of the main factors that inhibit this increase in resolution is the size of each TFT. Further, in order to normally operate the TFTs, the TFTs are required to be electrically isolated from each other. A technology of electrically isolating the electronic elements such as the TFTs from each other is referred to as element isolation. The element isolation of the TFTs is generally realized by patterning respective channel regions of the TFTs into island shapes by using photolithography and dry etching or wet etching so as to be electrically independent from each other.

At present, in the element isolation realized by patterning the semiconductor films of the TFTs into island shapes, the smallest element size may be obtained when dry etching is employed. However, a very expensive vacuum apparatus is used in dry etching, which is a cause of increase in production cost. Further, the size of the semiconductor film is determined not only by the process accuracy of the semiconductor film, but also by considering a contact between the semiconductor film and an electrode. In order to reduce the cost, it is effective to employ wet etching. However, wet etching is lower in process accuracy than dry etching in some cases. Further, in a case where a material which changes its electrical characteristics due to moisture is used as the semiconductor material in the channel region, a certain limitation may be added when finely formed due to the moisture adsorption to the channel region in the wet process or the like, or a throughput may be decreased due to addition of drying process or the like.

Further, as a method of forming independent island-shaped channel regions other than the above, there is a method which uses a shadow mask at the time of film formation for element isolation, but in this case, the process accuracy is further decreased than the case of employing wet etching.

Meanwhile, as a technology of isolating the elements from each other without patterning the semiconductor film into island shapes, there are a method in which a barrier is used for element isolation (Japanese Patent Application Laid-Open No. 2007-220713), and a method in which a semiconductor film in an element isolation region is increased in resistance by doping impurities for element isolation (U.S. Pat. No. 4,962,412).

By the way, the technologies described in Japanese Patent Application Laid-Open No. 2007-220713 and U.S. Pat. No. 4,962,412, in which the semiconductor film is not patterned into island shapes, require forming of the barrier or impurity doping, and hence those technologies do not have advantages in terms of process accuracy compared with the technology in which the semiconductor film is patterned into island shapes. Therefore, there are demands for further improvement in process accuracy when the semiconductor electronic element such as the TFT is finely formed and for reduction in cost.

SUMMARY OF THE INVENTION

Therefore, it is an object of the present invention to provide an electronic device with which a process accuracy can be improved when a semiconductor electronic element is finely formed, a cost can be reduced, and further elements can be isolated from each other, and to provide a method of isolating elements of the electronic device, a method of producing the electronic device, and a display apparatus including the electronic device.

In order to achieve the above-mentioned object, the present invention is structured as described below.

That is, an electronic device according to the present invention includes: multiple electronic elements each including a semiconductor film; and an element isolation region provided between adjacent ones of the multiple electronic elements, the element isolation region including a semiconductor film having a bandgap of 1.95 eV Or more, an insulating film, and an element isolation electrode, the element isolation electrode being an electrode which is separated from the semiconductor film of the element isolation region by the insulating film and is applied with a voltage so as to increase a resistance of the semiconductor film of the element isolation region, to thereby electrically isolate the multiple electronic elements from one another.

Further, a method of isolating elements of an electronic device according to the present invention, the electronic device including: multiple electronic elements each including a semiconductor film; and an element isolation region provided between adjacent ones of the multiple electronic elements, the element isolation region including a semiconductor film having a bandgap of 1.95 eV Or more, an insulating film, and an element isolation electrode, includes applying a constant voltage to the element isolation electrode, which is separated from the semiconductor film of the element isolation region by the insulating film, to increase a resistance of the semiconductor film of the element isolation region, and to thereby electrically isolate the multiple electronic elements from one another.

Further, a method of producing an electronic device according to the present invention, the electronic device including multiple electronic elements each including a semiconductor film, includes: forming a semiconductor film having a bandgap of 1.95 eV or more; forming an insulating film; and forming an element isolation electrode, whereby the element isolation electrode is separated from the semiconductor film having the bandgap of 1.95 eV or more by the insulating film, and an element isolation region is formed, in which a voltage is applied to the element isolation electrode to increase a resistance of the semiconductor film having the bandgap of 1.95 eV or more, to thereby electrically isolate the multiple electronic elements from one another.

According to the present invention, by forming the element isolation electrode so as to be separated from the semiconductor film having the bandgap of 1.95 eV or more by the insulating film and applying a voltage to the element isolation electrode, the semiconductor film having the bandgap of 1.95 eV or more is increased in resistance, and hence the electronic elements can be electrically isolated from each other with the use of an electric field effect. Therefore, compared with the technology in which the semiconductor film is patterned into island shapes, an excellent effect is achieved that the process accuracy improves even when the semiconductor electronic element is finely formed and the cost is reduced.

Further features of the present invention will become apparent from the following description of exemplary embodiments with reference to the attached drawings.

DESCRIPTION OF THE EMBODIMENTS

Figure 1:
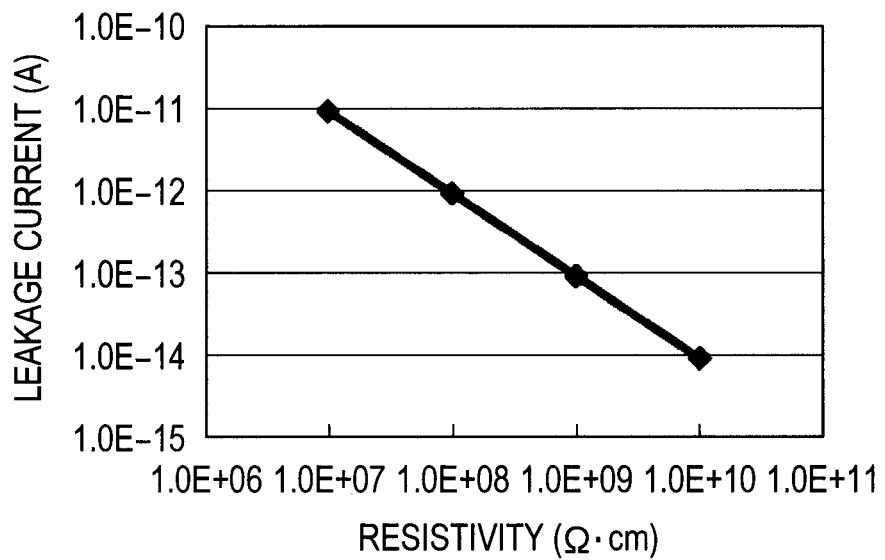
FIG. 1 is a graph illustrating a relationship between a resistivity of a semiconductor film and a leakage current between TFTs.

Hereinafter, embodiments of the present invention are described with reference to the drawings. However, the present invention is not limited to those embodiments. Further, a well-known or publicly-known technology in the field of the art is applied to portions which are not particularly illustrated or described in this specification.

First, an embodiment of an electronic device according to the present invention is described. Note that, specific stack structures of the electronic device according to the present invention are described in detail in Examples 1 to 4 described later.

The electronic device of this embodiment is an electronic device including multiple electronic elements each including a semiconductor film. Specific examples of the electronic elements include a thin film transistor (TFT), a diode, and a resistor. An element isolation region is provided between the electronic elements. The element isolation region includes a semiconductor film having a bandgap of 1.95 eV or more, an insulating film, and an element isolation electrode.

The semiconductor film of the element isolation region and the semiconductor film forming a channel of the electronic element may be semiconductor films which include a material having the same main component and have the same polarity (n type or p type), or may be semiconductor films which include different materials and have different polarities. The case that both the semiconductor films include a material having the same main component and have the same polarity is more preferred because it is unnecessary to form a pnp junction for element isolation, which is conventionally known, and further, the semiconductor film forming the channel of the electronic element and the semiconductor film of the element isolation region may be formed in one process.

The insulating film may be made of any material to form a general insulating film. Examples of the material may include an inorganic material such as $SiO_2$, SiN, $HfO_2$, and $Y_2O_3$, or an organic material such as polyimide and polyvinyl alcohol.

The element isolation electrode is an electrode which is separated from the semiconductor film of the element isolation region by the insulating film, and is applied with a voltage so as to increase the resistance of the semiconductor film of the element isolation region with the use of an electric field effect, to thereby electrically isolate the electronic elements from each other. The element isolation electrode may be above or below the semiconductor film while sandwiching the insulating film. It is also possible to divide the element isolation electrode into multiple regions, and apply a voltage for element isolation only to the region in which the operating electronic element is included but avoid applying a voltage to other regions. With this, it is possible to reduce power consumption necessary for voltage application to the element isolation electrode. Further, the element isolation electrode may be made of a metal material such as Al, Au, Cu, Mo, and Ti, or a stack film thereof, or may be made of a conductive oxide such as an indium tin oxide (ITO) and an indium zinc oxide (IZO).

In the conventional method, the element isolation region has been determined based on a sum of a patterning accuracy of the semiconductor film of the TFT and a margin of superposition (alignment) between the semiconductor film of the TFT and the electrode or the contact hole. In contrast to this, in the present invention, the element isolation region can be determined based on a patterning accuracy of only the source and drain terminals of the TFT or a patterning accuracy of only the element isolation electrode, and hence the elements may be formed finely and with high integration. Note that, because element isolation is electrically performed, the element isolation electrode may be or may not be patterned.

In a case where the electronic element is a TFT, the TFT may have any one of a bottom gate structure and a top gate structure. Further, in a case where a light shielding film is necessary in the TFT, the light shielding film of the TFT can be formed of the same film as the element isolation electrode. By using the same film as the light shielding film, the number of processes for film formation may be reduced.

First, with reference to FIG. 1, increase in resistance of the semiconductor film of the element isolation region is described. Note that, "increase in resistance" refers to a state in which depletion of the semiconductor film of the element isolation region occurs through application of a voltage to the element isolation electrode.

FIG. 1 is a graph illustrating a relationship between a resistivity of the semiconductor film of the element isolation region existing between the TFTs and a leakage current between the TFTs, in a case where multiple TFTs are disposed as drive transistors in each pixel of a display apparatus having a resolution of about 211 ppi. Note that, the film thickness of the semiconductor film of the TFT and the film thickness of the semiconductor film of the element isolation region are respectively assumed to be 30 nm, and a voltage applied between the source and drain terminals of the TFT is assumed to be 10 V.

In a display apparatus having a resolution of about 211 ppi, in a case where full color display of three colors of red (R), green (G), and blue (B) is performed, the pixel size corresponds to a sub-pixel (a pixel for one color when one pixel is constituted of three colors) having a 40 μm pitch in a short-side direction and a 120 μm pitch in a long-side direction. In a case where multiple TFTs are disposed in this sub-pixel, the distance between the source and drain terminals of the adjacent TFTs is about 10 μm, and the width of the source and drain terminals is about 30 μm.

Here, the TFTs and the leakage current between the TFTs are limited by conditions for retaining a gradation voltage for determining a gradation. For example, when a gradation retention capacitance is 0.2 pF and the leakage current is $10^{-11}$ A or less, a gradation voltage fluctuation in one frame (1/60 seconds) is $10^{-11} \cdot (1/60) \cdot (1/(0.2 \cdot 10^{-12})) = 0.83$ V. Thus, the gradation voltage fluctuation may be suppressed to be 1 V or less.

Therefore, the gradation voltage fluctuation may be suppressed to be 1 V or less by setting the leakage current to be $10^{-11}$ A or less, and with reference to FIG. 1, by setting the resistivity of the semiconductor film to be $10^7$ Ω·cm or more. Further, when the resistivity of the semiconductor film is $10^{10}$ Ω·cm or more, the leakage current may be suppressed to be $10^{-12}$ A or less even if the distance between the source and drain terminals is 1 μm.

As described above, in this embodiment, a constant voltage is applied to the element isolation electrode, to thereby increase the resistance of the semiconductor film of the element isolation region, that is, cause the depletion of the semiconductor film of the element isolation region. In this manner, the leakage current may be suppressed as described above, which enables element isolation. The resistivity of the semiconductor film of the element isolation region when depletion is caused is preferably $10^7$ Ω·cm or more as described above, and more preferably $10^{10}$ Ω·cm or more.

Next, a voltage applied to the element isolation electrode is described.

The voltage applied to the element isolation electrode is preferred to be, when the semiconductor film is of an n-type, equal to or less than the minimum voltage directly applied to the electrode for element drive, and when the semiconductor film is of a p-type, equal to or more than the maximum voltage directly applied to the electrode for element drive. Therefore, the voltage applied to the element isolation electrode is required to be, in the case of an n-type semiconductor, a voltage lower than a voltage at which the semiconductor film exhibits a flat-band and, in the case of a p-type semiconductor, a voltage higher than the voltage at which the semiconductor film exhibits a flat-band. The voltage at which the semiconductor film exhibits a flat-band depends on the work function of the electrode material, the Fermi level of the semiconductor film, the trap in the semiconductor film or at an interface between the semiconductor film and the insulating film, and the like. In the simplest case where the work function of the electrode material matches the Fermi level of the semiconductor film and there is no influence of the trap or the like, when the voltage directly applied to the electrode for element drive is 0 V, the semiconductor film exhibits a flat-band when 0 V is applied to the element isolation electrode. At this time, the voltage to be applied to the element isolation electrode is set to 0 V or lower when the semiconductor film is of an n-type, and to 0 V or higher when the semiconductor film is of a p-type, to thereby cause the depletion of the semiconductor film.

The voltage necessary for the depletion of the semiconductor film of the element isolation region depends on a carrier density ND of the semiconductor film under a state in which the electric field is not applied and a film thickness ts of the semiconductor film. As the carrier density becomes lower, and as the film thickness becomes thinner, the voltage required for the depletion becomes smaller. For example, in an ideal state in which there is no trap in the semiconductor film or at the interface, and flat band voltages of the semiconductor film and the element isolation electrode for causing depletion of the semiconductor film are 0, an absolute value |VB| of the voltage necessary for causing depletion of the entire semiconductor film is expressed by the following expressions (1) and (2).

$|VB| = (q \cdot ND/(2 \cdot \in s)) \cdot (ts^2 + 2 \cdot ts \cdot \in s/C)$   Expression (1)

$|VB| \approx ts \cdot q \cdot ND/C$   Expression (2)

where q represents an elementary charge, ∈s represents a dielectric constant of the semiconductor film, and C represents a capacitance per unit area of the insulating film between the semiconductor film and the element isolation electrode. Further, Expression (2) is an approximation when considering only the second term of the right side of Expression (1), and is satisfied when the film thickness of the semiconductor film is equivalent to the film thickness of the insulating film or is thinner than the film thickness of the insulating film, and when the dielectric constant of the semiconductor film is larger than the dielectric constant of the insulating film.

According to Expression (2), in a case where the insulating film is formed of an Si oxide film of 100 nm, when ts·ND is $10^{12}$ cm$^{-2}$ or smaller, |VB| is 5 V or smaller. That is, when the capacitance per unit area is calculated based on the vacuum dielectric constant, the Si oxide relative dielectric constant of 3.9, and the film thickness of the insulating film of 100 nm, $C = 3.45 \times 10^{-8}$ F/cm$^2$ is satisfied, and hence |VB|=4.6 V is satisfied. At this time, when ND is $10^{18}$ cm$^{-3}$, ts is required to be 10 nm or smaller. Generally, the film thickness of the semiconductor film is required to be 10 nm or larger, and hence the carrier density of the semiconductor film under a state in which the electric field is not applied thereto is preferred to be $10^{18}$ cm$^{-3}$ or smaller. If the carrier density of the semiconductor film under a state in which the electric field is not applied thereto is $10^{16}$ cm$^{-3}$ or smaller, even if the insulating film is set to 200 nm and the semiconductor film is set to 100 nm, it is possible to suppress |VB| to be 5 V or smaller.

As described above, in this embodiment, when the electric field is not applied, the carrier density of the semiconductor film is preferably $10^{18}$ cm$^{-3}$ or smaller, and more preferably $10^{16}$ cm$^{-3}$ or smaller. By setting the carrier density of the semiconductor film to be $10^{18}$ cm$^{-3}$ or smaller, more preferably $10^{16}$ cm$^{-3}$ or smaller, the voltage to be applied to the element isolation electrode may be suppressed to be 5 V or smaller.

By the way, in a case where OFF operation of a field-effect transistor is employed with respect to an active matrix circuit of a display element such as a liquid crystal cell or an electroluminescent element (EL element) as described in U.S. Pat. No. 4,962,412, the number of potential levels which may be applied to the gate terminal for element isolation has a limitation. This is because, as the number of applications of different potential levels increases, the number of wirings for the element isolation electrode and a space therefor, and the number of production processes for insulating the wirings are increased. Therefore, it is important that the voltage to be applied to the element isolation electrode be a constant voltage.

The simplest pixel circuit of a display apparatus including an organic EL element as a display element is exemplified. The pixel circuit of the organic EL element includes two transistor elements, one capacitor element, and the organic EL element. The first transistor element is used as a switching transistor for pixel selection, and the second transistor element is used as a drive transistor of the organic EL element.

When the pixel circuits have an active matrix pattern, the source potentials of the two transistors are different at a certain moment, and those are also different from the source potential of the drive transistor of the adjacent pixel. In a case of using, as the semiconductor film, amorphous silicon or low-temperature polysilicon, which is generally used in an active matrix circuit of a display element, the optimum potential for the element isolation electrode, which determines the minimum value of the off current, differs by the difference among the source potentials of the respective elements.

In an n-type amorphous silicon or low-temperature polysilicon TFT, when the gate potential is increased to the negative side with respect to the optimum potential for the element isolation electrode, which determines the minimum value of the off current, a current with a reverse polarity starts to flow due to hole injection. Also in a p-type low-temperature polysilicon TFT, when the gate potential is increased to the positive side with respect to the optimum potential for the element isolation electrode, which determines the minimum value of the off current, a current with a reverse polarity starts to flow due to electron injection. That is, when the amorphous silicon or the low-temperature polysilicon is used as the semiconductor film and a constant voltage is applied to the element isolation electrode, the optimum potential for the element isolation electrode, which determines the minimum value of the off current, differs by the difference among the source potentials of the respective elements. Therefore, the leakage current in element isolation increases between any of the elements. Therefore, there is a large limitation in design for suppressing the leakage current, for example, increasing the width of the element isolation region to gain resistivity of the semiconductor film, which makes it difficult to obtain the effect of fine formation of the present invention.

As described above, when the amorphous silicon or the low-temperature polysilicon is used as the semiconductor film, a current flows due to injection of a carrier with a polarity reverse to the polarity of the semiconductor film. Therefore, in this embodiment, a semiconductor film having a wide bandgap is used. The minimum value of the carrier density of the semiconductor film when depletion of the semiconductor film of the element isolation region occurs is determined based on the intrinsic carrier density, that is, the bandgap. As the bandgap widens, it is possible to suppress the current flow due to injection of a carrier with a polarity reverse to the polarity of the semiconductor film.

According to the band theory, the relation between an intrinsic carrier density ni and a bandgap Eg may be expressed by the following Expression (3).

$$ni=(NC \cdot NV)^{1/2} \cdot \mathrm{Exp}(-Eg/(2 \cdot k \cdot T)) \qquad \text{Expression (3)}$$

where NC and NV represent effective densities of states of a conduction band and a valence band, respectively, k represents a Boltzmann's constant, and T represents an absolute temperature. NC and NV differ depending on the semiconductor material, but in the case of Si, NC and NV are both about $3 \times 10^{19}$ cm$^{-3}$ at room temperature (300 K). In the case where the bandgap Eg is 1.65 eV, when the above-mentioned numerical values are employed, the intrinsic carrier density is $4 \times 10^5$ cm$^{-3}$. Further, according to the expression ($\rho=1/(q \cdot ni \cdot \mu)$) where $\rho$ represents a resistivity, q represents an elementary charge, ni represents a carrier density, and $\mu$ represents a mobility, when the mobility is $\mu=1.07 \times 10^3$ cm$^2$/(V·s), the resistivity of the semiconductor film is $1.46 \times 10^{10}$ Ω·cm, and hence increase in resistance can be realized. However, the temperature dependency is required to be considered in the actual case, and the maximum value of the operation range temperature employed in the semiconductor electronic element is 85° C. (358 K). When the above-mentioned mobility is employed at the temperature of 85° C. (358 K), in a case where the bandgap Eg is 1.95 eV, the intrinsic carrier density is $6 \times 10^5$ cm$^{-3}$ and the maximum value of the resistivity of the semiconductor film is $10^{10}$ Ω·cm, which realizes the increase in resistance. That is, the present invention may be realized also in the case where the bandgap Eg is 1.65 eV, but considering the temperature dependency, the case with the bandgap Eg of 1.95 eV is preferred to surely realize the present invention.

From the facts described above, in this embodiment, a metal oxide semiconductor, a compound semiconductor, or the like with the bandgap of 1.95 eV or larger, more preferably 2.5 eV or larger, is used as the semiconductor film.

Examples of the metal oxide semiconductor satisfying the above-mentioned conditions include ZnO, which is an oxide of Zn, In$_2$O$_3$, which is an oxide of In, In—Zn—O (IZO), which is an oxide of In and Zn, and In—Ga—Zn—O (IGZO), which is an oxide of In, Ga, and Zn. The structure of those metal oxide semiconductors may be any one of single crystal, polycrystal, and amorphous, but amorphous is more preferred because, in the case of amorphous, a process for crystallization is unnecessary and higher flatness and uniformity may be obtained.

Further, examples of the compound semiconductor satisfying the above-mentioned conditions include SiC and GaN. Diamond (C) may be counted as another material with wide bandgap, and this is also applicable to the present invention.

Figure 2:
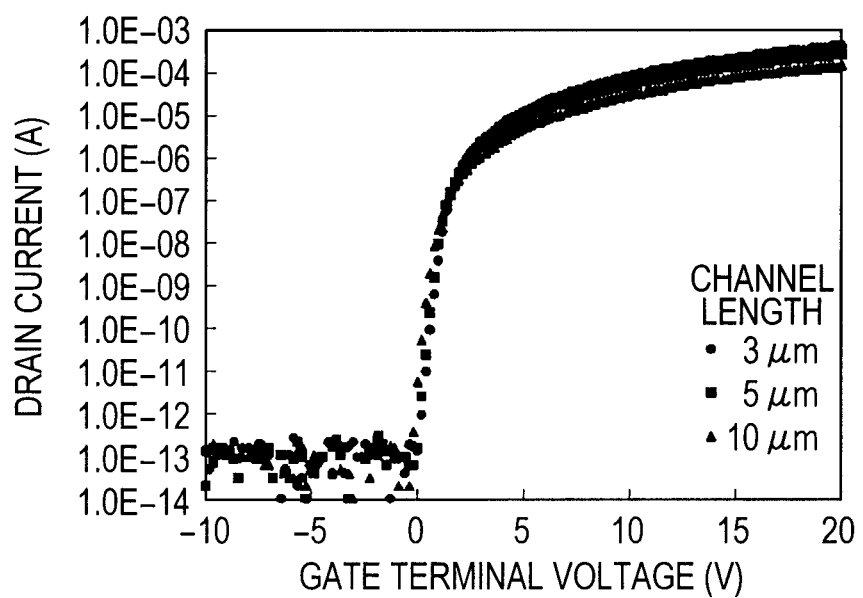
FIG. 2 is an explanatory graph illustrating an example of transmission characteristics of the TFTs.

FIG. 2 is an explanatory graph illustrating an example of transmission characteristics of the TFTs in which an n-type amorphous IGZO film having a carrier density of about $10^{15}$ cm$^{-3}$ and a bandgap of about 3 eV is used as the semiconductor film when the drain terminal voltage thereof is 12 V.

As illustrated in FIG. 2, through application of a negative voltage of −1 V or smaller to the gate terminal, in the TFT having a channel length of 10 μm, depletion of the semiconductor film occurs and the resistivity thereof becomes $10^7$ Ω·cm or larger. Thus, the drain current is suppressed to be $10^{-12}$ A or smaller. Further, in a case where the gate terminal voltage is −1 V or smaller, the drain current is $10^{-12}$ A or smaller regardless of the channel length, and hence even when the channel length is shorter than 3 μm, the drain current is expected to be $10^{-12}$ A or smaller. Therefore, when the n-type amorphous IGZO film is used as the semiconductor film of the element isolation region and a negative voltage of −1 V or smaller is applied to the electrode for element isolation, even in the case where the distance between the elements is 3 μm or smaller, the leakage current can be suppressed to be $10^{-12}$ A or smaller. This low leakage current is caused by the wide bandgap of the amorphous IGZO film as described above.

Next, an embodiment of a method of isolating elements of an electronic device according to the present invention is described.

The method of isolating elements of an electronic device according to this embodiment, the electronic device including: multiple electronic elements each including a semiconductor film; and an element isolation region provided between adjacent ones of the multiple electronic elements, the element isolation region including a semiconductor film, an insulating film, and an element isolation electrode, includes applying a constant voltage to the element isolation electrode, which is separated from the semiconductor film of the element isolation region by the insulating film. The semiconductor film of the element isolation region is a semiconductor film having a bandgap of 1.95 eV or larger. By applying a constant voltage to the element isolation electrode as described above, a resistance of the semiconductor film of the element isolation region may be increased, to thereby electrically isolate the electronic elements from each other. Examples of the semiconductor film of the element isolation region may include a metal oxide semiconductor, a compound semiconductor, or the like with the bandgap of 1.95 eV or larger, more preferably 2.5 eV or larger. Examples of the materials of the semiconductor film, the insulating film, and the element isolation electrode include materials described above.

Subsequently, an embodiment of a method of producing an electronic device according to the present invention is described.

The method of producing an electronic device of this embodiment, the electronic device including multiple electronic elements each including a semiconductor film, includes: forming a semiconductor film having a bandgap of 1.95 eV or larger; forming an insulating film; and forming an element isolation electrode. Through the forming of those components, the element isolation electrode is separated from the semiconductor film having a bandgap of 1.95 eV or larger by the insulating film, and an element isolation region is formed, which includes the semiconductor film having a bandgap of 1.95 eV or larger, the insulating film, and the element isolation electrode. The element isolation electrode is applied with a constant voltage to increase the resistance of the semiconductor film of the element isolation region, to thereby electrically isolate the electronic elements from each other. Examples of the semiconductor film of the element isolation region may include a metal oxide semiconductor, a compound semiconductor, or the like with the bandgap of 1.95 eV or larger, more preferably 2.5 eV or larger. Examples of the materials of the semiconductor film, the insulating film, and the element isolation electrode include materials described above.

Finally, an embodiment of a display apparatus including the electronic device according to the present invention is described.

The display apparatus including the electronic device according to this embodiment includes TFTs as components of the active matrix display apparatus, in which: the TFTs have an element isolation region provided therebetween; and a constant voltage is applied to an element isolation electrode, which is separated from a semiconductor film of the element isolation region by an insulating film. The semiconductor film of the element isolation region is a semiconductor film having a bandgap of 1.95 eV or larger. By applying a constant voltage to the element isolation electrode as described above, a resistance of the semiconductor film of the element isolation region may be increased, to thereby realize the element isolation between the TFTs. Further, the display apparatus according to this embodiment includes an organic EL element as a display element, and electrically controls the brightness of the organic EL element. In this embodiment, the semiconductor film of the element isolation region and the semiconductor film of the TFT may be provided in common. When the semiconductor film of the element isolation region and the semiconductor film of the TFT are provided in common, the element isolation region may be determined based on the distance between the source and drain terminals of different TFTs or the width of the element isolation electrode. Therefore, in the display apparatus of this embodiment, the patterning of the semiconductor film may be omitted and the area of the element isolation region may be reduced, which enables reducing the production cost and increasing the resolution.

The preferred embodiments of the present invention have been described above, but those are exemplary embodiments for the description of the present invention, and various modes different from those embodiments are applicable without departing from the scope of the present invention.

For example, in the embodiments described above, an organic EL element is exemplified as the display element, but the display element may be a liquid crystal cell. In this case, for example, an EL element is necessary as a backlight additionally.

EXAMPLES

The electronic device according to the present invention is described in detail below by means of Examples, but the present invention is not limited to those Examples.

Example 1

Figure 3:
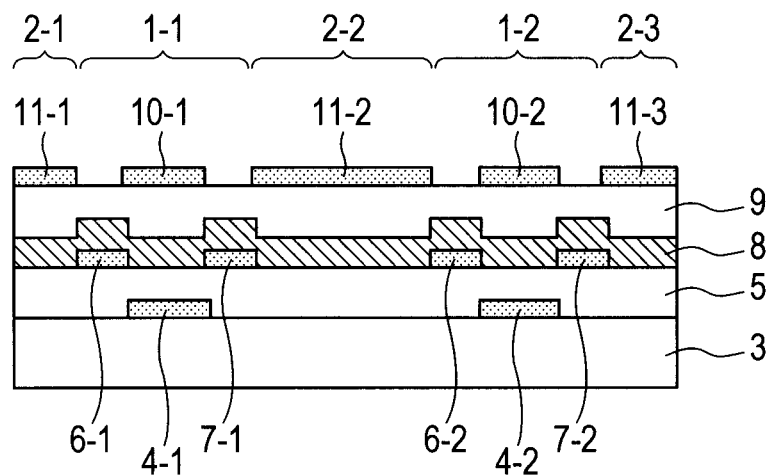
FIG. 3 is a schematic cross-sectional view illustrating a stack structure of an electronic device of Example 1.
Figure 4:
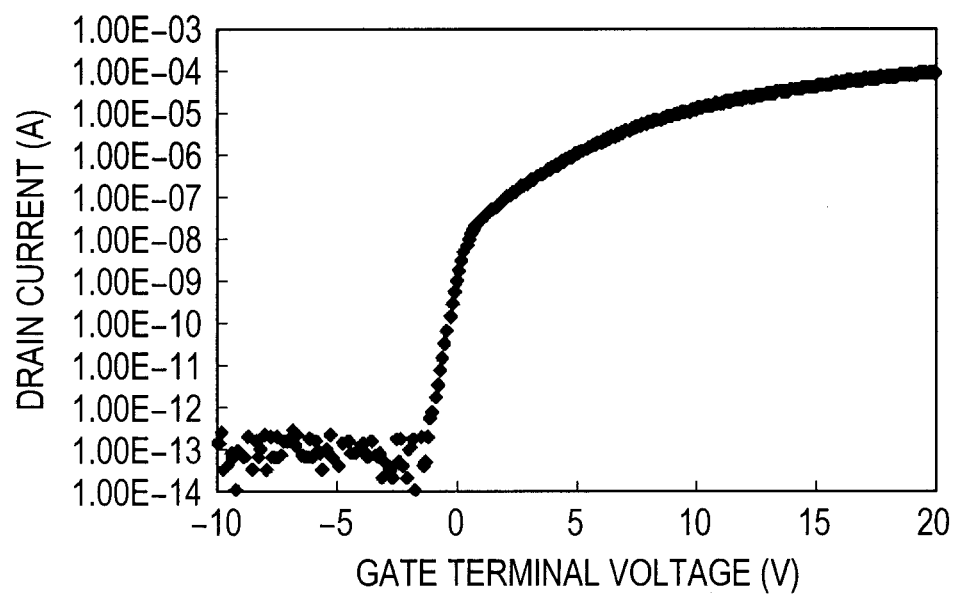
FIG. 4 is an explanatory graph illustrating transmission characteristics of TFTs in the electronic device of Example 1.
Figure 5:
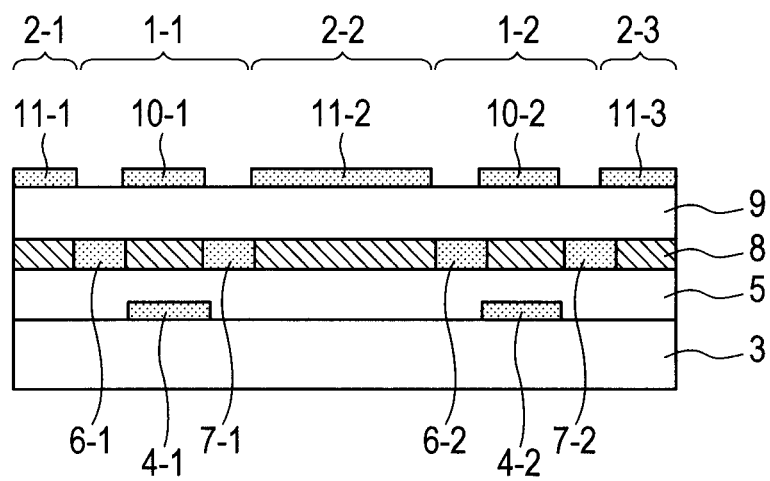
FIG. 5 is a schematic cross-sectional view illustrating a stack structure of an electronic device including coplanar type TFTs.

With reference to FIGS. 3 to 5, a structure of an electronic device of Example 1 is described. FIG. 3 is a schematic cross-sectional view illustrating a stack structure of the electronic device of this example. FIG. 4 is an explanatory graph illustrating transmission characteristics of TFTs in the electronic device of this example. FIG. 5 is a schematic cross-sectional view illustrating a stack structure of an electronic device including bottom gate coplanar type TFTs, as a modified example of this example.

The electronic device of this example is an electronic device including an inverted-staggered TFT, in which a semiconductor film of an element isolation region and a semiconductor film of the TFT are integrally formed, and elements are isolated from each other by applying a voltage to an element isolation electrode, which is formed of the same film as a light shielding film. That is, as illustrated in FIG. 3, an amorphous IGZO film having a bandgap of about 3 eV is used as a semiconductor film 8, and the electronic device includes two inverted-staggered (bottom gate) TFT elements 1-1 and 1-2, and field-effect element isolation regions 2-1 to 2-3.

First, on a glass substrate 3 (1737 manufactured by Corning Incorporated), an Mo film having a film thickness of 100 nm was deposited by sputtering. Then, the Mo film was patterned by photolithography and dry etching to form gate terminals 4-1 and 4-2.

Next, as a gate insulating film 5, an amorphous $SiO_x$ film having a film thickness of 200 nm was deposited by CVD. On the gate insulating film 5, an indium tin oxide (ITO) film having a film thickness of 30 nm was deposited by sputtering. Then, the ITO film was patterned by photolithography and wet etching to form source terminals 6-1 and 6-2 and drain terminals 7-1 and 7-2.

Subsequently, as the semiconductor film 8 (the semiconductor film of the element isolation region and the semiconductor film of the TFT), an amorphous IGZO film having a film thickness of 30 nm was deposited at room temperature by sputtering. At this time, a mixed gas of oxygen and argon with an oxygen flow rate of 2% was used as the sputtering gas, and the total pressure of the mixed gas of oxygen and argon was set to $5.0 \times 10^{-1}$ Pa.

Further, as an insulating film 9, an amorphous $SiO_x$ film having a film thickness of 200 nm was deposited by CVD.

After that, an Mo film having a film thickness of 200 nm was deposited by sputtering. Then, the Mo film was patterned by photolithography and dry etching to simultaneously form light shielding films 10-1 and 10-2 and element isolation electrodes 11-1 to 11-3.

Finally, thermal processing of 250° C. was performed in the atmosphere for one hour. With the series of steps described above, the electronic device having a stack structure of FIG. 3 was formed.

FIG. 4 illustrates the transmission characteristics of the TFTs in the electronic device of this example. Note that, in the transmission characteristics illustrated in FIG. 4, the channel length of the TFT is 10 µm, the channel width thereof is 60 µm, the voltage of the source terminal is 0 V, the voltage of the drain terminal is 12 V, and the voltage of the light shielding film is 0 V.

As illustrated in FIG. 4, even in the TFTs of this example, similarly to the transmission characteristics of the TFTs of FIG. 2 described above, when a voltage of −2 V or smaller was applied to the gate terminal, depletion of the semiconductor film occurred and the resistivity thereof became $10^7$ Ω·cm or larger. Thus, the drain current could be suppressed to be $10^{-12}$ A or smaller. Therefore, in a case where a negative voltage of −2 V or smaller is applied to the element isolation electrode 11-2 having a width of 10 µm or larger, the leakage current which flows between the drain terminal 7-1 of the TFT element 1-1 and the source terminal 6-2 of the TFT element 1-2 is $10^{-12}$ A or smaller. Thus, an element isolation function sufficient for actual use is obtained.

In the case where the semiconductor electronic elements are subjected to patterning for element isolation, the distance between the adjacent TFTs is generally required to be 10 µm or larger, but in this example, the distance between the adjacent TFTs may be 5 µm or smaller. Further, because the patterning of the semiconductor electronic elements is omitted, the electronic device including the TFT may be produced in lower cost.

In this example, the TFT includes bottom contact source and drain terminals, but top contact source and drain terminals may be employed instead, or a coplanar structure may be employed instead, in which semiconductor films of low resistance are used as the source and drain terminals as illustrated in FIG. 5. That is, FIG. 5 illustrates an electronic device including bottom gate coplanar type TFTs, in which the semiconductor film 8 (the semiconductor film of the element isolation region and the semiconductor film of the TFT) is formed in an integrated manner, and elements are isolated from each other by applying a constant voltage to the element isolation electrodes 11-1 to 11-3, which are formed of the same film as the light shielding films 10-1 and 10-2.

Further, the TFT in this example includes a light shielding film, but the light shielding film is not always necessary. In the case where the light shielding film is provided, the voltage applied to the light shielding film may be the same as that applied to the element isolation electrode, or may be different therefrom. Further, in the case where the light shielding film is provided, in the structure of this example, the element isolation electrode may be formed and patterned simultaneously with the light shielding film, and hence the number of steps does not increase due to the installation of the element isolation electrode.

Example 2

Figure 6:
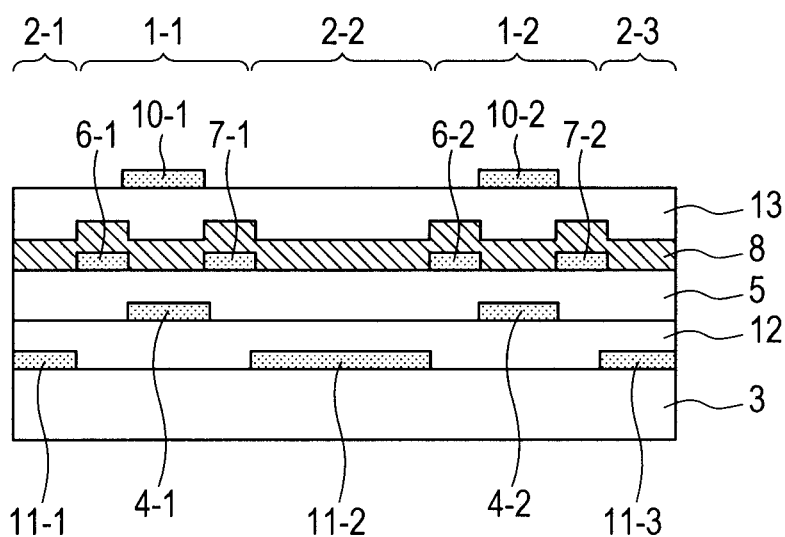
FIG. 6 is a schematic cross-sectional view illustrating a stack structure of an electronic device of Example 2.
Figure 7:
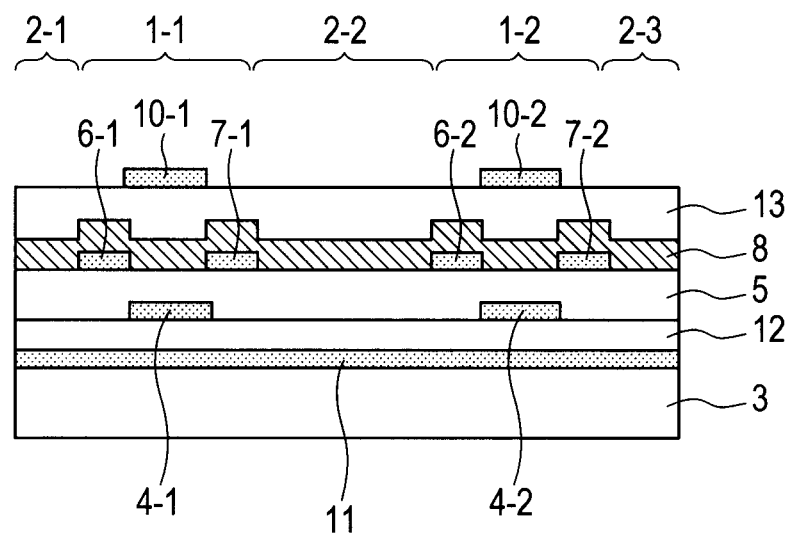
FIG. 7 is a schematic cross-sectional view illustrating a stack structure of an electronic device in a case where an element isolation electrode is not subjected to patterning.

With reference to FIGS. 6 and 7, a structure of an electronic device of Example 2 is described. FIG. 6 is a schematic cross-sectional view illustrating a stack structure of the electronic device of this example. FIG. 7 is a schematic cross-sectional view illustrating a stack structure of an electronic device in a case where the element isolation electrode is not subjected to patterning, as a modified example of this example.

The electronic device of this example is an electronic device including an inverted-staggered TFT, in which a semiconductor film of an element isolation region and a semiconductor film of the TFT are integrally formed, and elements are isolated from each other by applying a voltage to an element isolation electrode, which is formed below a gate terminal. That is, as illustrated in FIG. 6, the electronic device of this embodiment includes two inverted-staggered TFT elements 1-1 and 1-2, which use an amorphous IGZO film having a bandgap of about 3 eV as the semiconductor film 8, and field-effect element isolation regions 2-1 to 2-3.

First, on a glass substrate 3 (1737 manufactured by Corning Incorporated), an Mo film having a film thickness of 100 nm was deposited by sputtering. Then, the Mo film was patterned by photolithography and dry etching to form element isolation electrodes 11-1 to 11-3.

Next, as a first insulating film 12, an amorphous $SiO_x$ film having a film thickness of 200 nm was deposited by CVD. On the gate insulating film 5, an Mo film having a film thickness of 100 nm was deposited again by sputtering. Then, the Mo film was patterned by photolithography and dry etching to form gate terminals 4-1 and 4-2.

In addition, as a gate insulating film 5, an amorphous $SiO_x$ film having a film thickness of 200 nm was deposited by CVD. On the gate insulating film 5, an ITO film having a film thickness of 30 nm was deposited by sputtering. Then, the ITO film was patterned by photolithography and wet etching to form source terminals 6-1 and 6-2 and drain terminals 7-1 and 7-2.

Subsequently, as the semiconductor film 8 (the semiconductor film of the element isolation region and the semiconductor film of the TFT), an amorphous IGZO film having a film thickness of 30 nm was deposited at room temperature by sputtering. At this time, a mixed gas of oxygen and argon with an oxygen flow rate of 2% was used as the sputtering gas, and the total pressure of the mixed gas of oxygen and argon was set to $5.0 \times 10^{-1}$ Pa.

Further, as a second insulating film 13, an amorphous $SiO_x$ film having a film thickness of 200 nm was deposited by CVD.

After that, an Mo film having a film thickness of 200 nm was deposited by sputtering. Then, the Mo film was patterned by photolithography and dry etching to simultaneously form light shielding films 10-1 and 10-2. With the series of steps described above, the electronic device having a stack structure of FIG. 6 was formed.

In this example, without subjecting the semiconductor film to an etching process, an inverted-staggered TFT element illustrated in FIG. 6 is completed, in which the semiconductor film of the element isolation region and the semiconductor film of the TFT are integrally formed.

In the electronic device of this example, similarly to Example 1, the leakage current which flows between the drain terminal 7-1 of the TFT element 1-1 and the source terminal 6-2 of the TFT element 1-2 can be suppressed to be $10^{-12}$ A or smaller. Thus, an element isolation function sufficient for actual use is obtained.

In the case where the semiconductor electronic elements are subjected to patterning for element isolation, the distance between the adjacent TFTs is generally required to be 10 µm or larger, but with this example, the distance between the adjacent TFTs may be 5 µm or smaller.

As illustrated in FIG. 7, the patterning to obtain the element isolation electrodes 11-1 to 11-3 of this example may be omitted. That is, FIG. 7 illustrates an electronic device including an inverted-staggered TFT, in which the semiconductor film 8 (the semiconductor film of the element isolation region and the semiconductor film of the TFT) is formed in an integrated manner, and elements are isolated from each other by applying a voltage to an element isolation electrode 11, which is formed below the gate terminals 4-1 and 4-2 without being patterned. As described above, in the case where the element isolation electrode 11 is not subjected to patterning, the element isolation region corresponds to an interval between the drain terminal 7-1 of the TFT element 1-1 and the source terminal 6-2 of the TFT element 1-2. In this case, the minimum size of the element isolation region is determined based on the patterning accuracy of the source and drain terminals.

Further, the TFT of FIG. 6 includes bottom contact source and drain terminals, but top contact source and drain terminals may be employed instead, or a coplanar structure as illustrated in FIG. 5 may be employed instead.

Example 3

Figure 8:
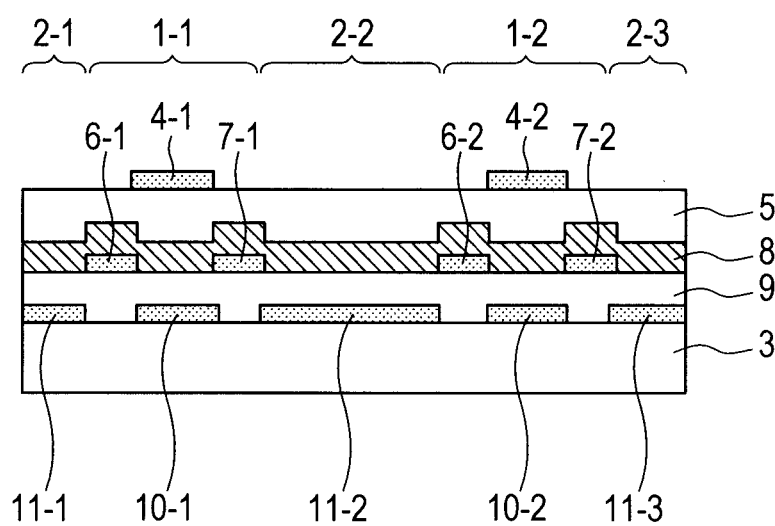
FIG. 8 is a schematic cross-sectional view illustrating a stack structure of an electronic device of Example 3.

With reference to FIG. 8, a structure of an electronic device of Example 3 is described. FIG. 8 is a schematic cross-sectional view illustrating a stack structure of the electronic device of this example.

The electronic device of this example is an electronic device including a staggered TFT, in which a semiconductor film of an element isolation region and a semiconductor film of the TFT are integrally formed, and the element isolation region is formed by applying a voltage to an element isolation electrode, which is formed of the same film as the light shielding film formed below the semiconductor film. That is, as illustrated in FIG. 8, the electronic device of this example includes two staggered (top gate) TFT elements 1-1 and 1-2, which use an amorphous IGZO film having a bandgap of about 3 eV as the semiconductor film 8, and field-effect element isolation regions 2-1 to 2-3.

First, on a glass substrate 3 (1737 manufactured by Corning Incorporated), an Mo film having a film thickness of 200 nm was deposited by sputtering. Then, the Mo film was patterned by photolithography and dry etching to simultaneously form light shielding films 10-1 and 10-2 and element isolation electrodes 11-1 to 11-3.

Next, as an insulating film 9, an amorphous $SiO_x$ film having a film thickness of 200 nm was deposited by CVD. On the insulating film 9, an ITO film having a film thickness of 30 nm was deposited by sputtering. Then, the ITO film was patterned by photolithography and wet etching to form source terminals 6-1 and 6-2 and drain terminals 7-1 and 7-2.

Subsequently, as the semiconductor film 8 (the semiconductor film of the element isolation region and the semiconductor film of the TFT), an amorphous IGZO film having a film thickness of 30 nm was deposited at room temperature by sputtering. At this time, a mixed gas of oxygen and argon with an oxygen flow rate of 2% was used as the sputtering gas, and the total pressure of the mixed gas of oxygen and argon was set to $5.0 \times 10^{-1}$ Pa.

Further, as a gate insulating film 5, an amorphous $SiO_x$ film having a film thickness of 200 nm was deposited by CVD. After that, an Mo film having a film thickness of 100 nm was deposited by sputtering. Then, the Mo film was patterned by photolithography and dry etching to form gate terminals 4-1 and 4-2. With the series of steps described above, the electronic device having a stack structure of FIG. 8 was formed.

In this example, without subjecting the semiconductor film to an etching process, a staggered TFT element illustrated in FIG. 8 is completed, in which the semiconductor film of the element isolation region and the semiconductor film of the TFT are integrally formed.

In the electronic device of this example, similarly to Example 1, the leakage current which flows between the drain terminal 7-1 of the TFT element 1-1 and the source terminal 6-2 of the TFT element 1-2 can be suppressed to be $10^{-12}$ A or smaller. Thus, an element isolation function sufficient for actual use is obtained.

In the case where the semiconductor electronic elements are subjected to patterning for element isolation, the distance between the adjacent TFTs is generally required to be 10 μm or larger, but with the method in this example, the distance between the adjacent TFTs may be 5 μm or smaller. Because the patterning of the semiconductor electronic elements is omitted, the electronic device including the TFT may be produced in lower cost.

In this example, in the case where the light shielding film is provided, the voltage applied to the light shielding film may be the same as that applied to the element isolation electrode, or may be different therefrom. Further, in the case where the light shielding film is provided, similarly to Examples 1 and 2, in the structure of this example, the element isolation electrode may be formed and patterned simultaneously with the light shielding film, and hence the number of steps does not increase due to the installation of the element isolation electrode.

Further, similarly to the element isolation electrode of FIG. 7 in Example 2, the element isolation electrode and the light shielding film may be provided in common. Further, the TFT of FIG. 8 in this example includes bottom contact source and drain terminals, but top contact source and drain terminals may be employed instead, or the coplanar structure of FIG. 5 described above may be employed instead.

Example 4

Figure 9:
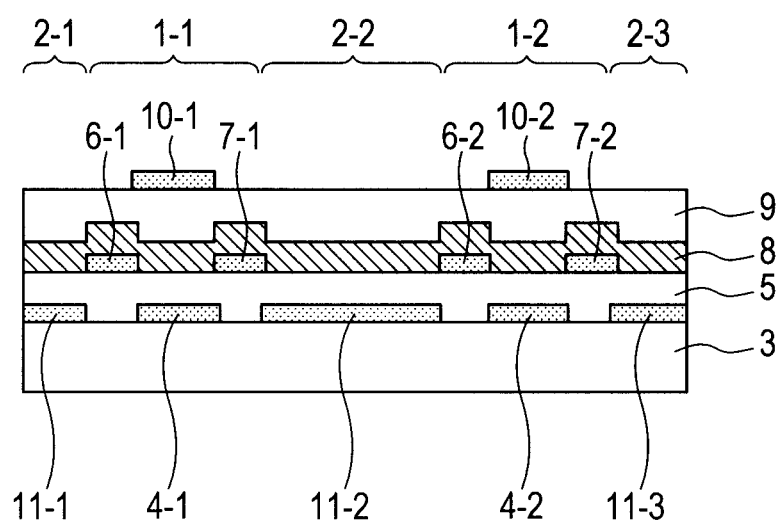
FIG. 9 is a schematic cross-sectional view illustrating a stack structure of an electronic device of Example 4.

With reference to FIG. 9, a structure of an electronic device of Example 4 is described. FIG. 9 is a schematic cross-sectional view illustrating a stack structure of the electronic device of this example.

The electronic device of this example is an electronic device including an inverted-staggered TFT, in which a semiconductor film of an element isolation region and a semiconductor film of the TFT are integrally formed, and the element isolation region is formed by applying a voltage to an element isolation electrode, which is formed of the same film as the gate terminal. That is, as illustrated in FIG. 9, the electronic device of this example includes two inverted-staggered TFT elements 1-1 and 1-2, which use an amorphous IGZO film having a bandgap of about 3 eV as the semiconductor film 8, and field-effect element isolation regions 2-1 to 2-3.

First, on a glass substrate 3 (1737 manufactured by Corning Incorporated), an Mo film having a film thickness of 100 nm was deposited by sputtering. Then, the Mo film was patterned by photolithography and dry etching to simultaneously form gate terminals 4-1 and 4-2 and element isolation electrodes 11-1 to 11-3.

Next, as a gate insulating film 5, an amorphous $SiO_x$ film having a film thickness of 200 nm was deposited by CVD. On the gate insulating film 5, an ITO film having a film thickness of 30 nm was deposited by sputtering. Then, the ITO film was patterned by photolithography and wet etching to form source terminals 6-1 and 6-2 and drain terminals 7-1 and 7-2.

Subsequently, as the semiconductor film 8 (the semiconductor film of the element isolation region and the semiconductor film of the TFT), an amorphous IGZO film having a film thickness of 30 nm was deposited at room temperature by sputtering. At this time, a mixed gas of oxygen and argon with an oxygen flow rate of 2% was used as the sputtering gas, and the total pressure of the mixed gas of oxygen and argon was set to $5.0 \times 10^{-1}$ Pa.

Further, as an insulating film 9, an amorphous $SiO_x$ film having a film thickness of 200 nm was deposited by CVD. After that, an Mo film having a film thickness of 200 nm was deposited by sputtering. Then, the Mo film was patterned by photolithography and dry etching to form light shielding films 10-1 and 10-2. With the series of steps described above, the electronic device having a stack structure of FIG. 9 was formed.

In this example, without subjecting the semiconductor film to an etching process, an inverted-staggered TFT element illustrated in FIG. 9 is completed, in which the semiconductor film of the element isolation region and the semiconductor film of the TFT are integrally formed.

In the electronic device of this example, similarly to Example 1, the leakage current which flows between the drain terminal 7-1 of the TFT element 1-1 and the source terminal 6-2 of the TFT element 1-2 can be suppressed to be $10^{-12}$ A or smaller. Thus, an element isolation function sufficient for actual use is obtained.

In the case where the semiconductor electronic elements are subjected to patterning for element isolation, the distance between the adjacent TFTs is generally required to be 10 μm or larger, but with the method in this example, the distance between the adjacent TFTs may be 5 μm or smaller. Because the patterning of the semiconductor electronic elements is omitted, the electronic device including the TFT may be produced in lower cost.

In the stack structure of this example, the element isolation electrode may be formed and patterned simultaneously with the gate terminal, and even in the case where the light shielding film is absent, the number of steps does not increase due to the installation of the element isolation electrode.

Further, the TFT of FIG. 9 in this example includes bottom contact source and drain terminals, but top contact source and drain terminals may be employed instead, or the coplanar structure of FIG. 5 described above may be employed instead.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-155920, filed Jul. 8, 2010, which is hereby incorporated by reference herein in its entirety.

What is claimed is:

1. An electronic device, comprising:
multiple electronic elements each including a semiconductor film; and
a field effect element isolation region provided between adjacent ones of the multiple electronic elements,
the field effect element isolation region comprising the semiconductor film having a bandgap of 1.95 eV or larger, an insulating film, and an element isolation electrode,
the semiconductor film having first portion included in one of the multiple electronic elements and second portion included in the field effect element isolation region so that the semiconductor film is shared by the one of the multiple electronic elements and the field effect element isolation region in each portion, wherein the second portion is extended continuously from the first portion, and
the element isolation electrode comprising an electrode which is separated from the semiconductor film of the field effect element isolation region by the insulating film and is applied with a voltage so as to increase a resistance of the semiconductor film of the field effect element isolation region based on an electric field effect, to thereby electrically isolate the multiple electronic elements from one another.

2. The electronic device according to claim 1, wherein the semiconductor film of the field effect element isolation region comprises a film including a metal oxide semiconductor.

3. The electronic device according to claim 1, wherein each of the multiple electronic elements comprises a thin film transistor.

4. The electronic device according to claim 3, wherein the semiconductor film forms a channel of the thin film transistor and includes a material having the same main component and the same polarity.

5. A display apparatus, comprising:
a display element; and
the electronic device according to claim 1.

6. The display apparatus according to claim 5, wherein the display element comprises an electroluminescent element.

7. The display apparatus according to claim 5, wherein the display element comprises a liquid crystal cell.

* * * * *